United States Patent [19]

Shuji

[11] 4,319,845

[45] Mar. 16, 1982

[54] METHOD FOR ACHIEVING ALIGNMENT BETWEEN OBJECTS

[75] Inventor: Takeshita Shuji, Yokohama, Japan

[73] Assignee: Fujitsu Limited, Kawasaki, Japan

[21] Appl. No.: 101,691

[22] Filed: Dec. 10, 1979

[30] Foreign Application Priority Data

Dec. 27, 1978 [JP] Japan .................................. 53/159981

[51] Int. Cl.$^3$ .............................................. G01B 11/00
[52] U.S. Cl. .............................. 356/400; 250/237 R; 356/375; 356/394
[58] Field of Search ................. 356/399–401, 356/395–396, 375, 394, 392, 372, 374; 250/561, 578, 237 R; 364/559, 561, 822; 358/107

[56] References Cited

U.S. PATENT DOCUMENTS

| | | | |
|---|---|---|---|
| 3,454,776 | 7/1969 | Hock | 250/237 R |
| 3,671,755 | 6/1972 | Hovius | 250/237 R |
| 3,806,254 | 4/1974 | Ha et al. | 356/395 |
| 4,065,212 | 12/1977 | Belleson et al. | 356/394 |
| 4,100,420 | 7/1978 | Metcalf et al. | 250/561 |
| 4,225,241 | 9/1980 | Dändliker et al. | 356/400 |

OTHER PUBLICATIONS

Kliever, W. H., "Measure Position Digitally", Control Engineering, 11/56, pp. 107–113.

*Primary Examiner*—William H. Punter
*Attorney, Agent, or Firm*—Staas & Halsey

[57] ABSTRACT

A method for achieving alignment between first objects and second objects. The method is comprised of the following steps:
(a) positioning the second objects slightly above the first objects;
(b) imaging both the first and second objects by using a sensor camera which generates an output signal and which is located directly thereabove;
(c) moving the first and second objects relative to each other within the field of view of the sensor camera;
(d) constructing a relationship curve with respect to variations of a first variable indicating the displacement of the second objects from the first objects and a second variable indicating the variation of the output signal from the sensor camera, and;
(e) stopping the movement of the second objects when the value of the second variable defining the relationship curve becomes equal to a predetermined desired value.

13 Claims, 26 Drawing Figures a)

b)

c)

d)

(a)

(b)

(a)

(b)

a)
b)
c)

METHOD FOR ACHIEVING ALIGNMENT BETWEEN OBJECTS

BACKGROUND OF THE INVENTION

1. Field of the Invention

The present invention relates to a method for achieving alignment between objects, and more particularly relates to a method for automatically achieving alignment in a computer aided positioning and installation system with respect to at least two objects to be overlapping.

Generally, in various kinds of installation systems, it is important to achieve alignment between objects to be overlapped. For example, in a system for manufacturing printed circuit units, it is important to achieve alignment between first objects, that is a plurality of terminal pads mounted on the surface of a printed board, and second objects, that is a plurality of leads from an IC (Integrated Circuit) package. Each of the leads is overlapped with a respective terminal pad, so that the leads and the respective terminal pads are correctly joined with solder. Since the IC package has many leads, for example several tens of leads, it is very difficult to achieve alignment between so many leads and the respective terminal pads with a high degree of accuracy and in a very short time.

2. The Prior Art

In the prior art, many kinds of methods for achieving alignment between leads and respective terminal pads have been proposed and put into practical use. A first method is carried out by utilizing a beam-splitter and a microscope. In the first method, the leads of an IC package are located about 30 cm above the terminal pads and the IC package is movably supported, in a horizontal plane, by a mechanical hand. An inspector observes the terminal pads directly through the microscope and the beam-splitter. At the same time, he observes an image of the leads through the microscope, which image is reflected from the beam-splitter. Then, he controls the mechanical hand and shifts the location of the IC package so as to coincide the image of the leads with the respective terminal pads. When coincidence is obtained, he shifts the package downward, so that the leads correctly contact the respective terminal pads. However, this first method has a defect in that it is difficult to achieve alignment with a high degree of accuracy and in a very short time.

A second method is carried out by utilizing a magnifying apparatus. In the second method, the image of the leads and also the image of the terminal pads are projected on a screen. The inspector controls the mechanical hand so as to coincide both images with each other on the screen. When coincidence is obtained, he shifts the package downward, and then the leads correctly contact the respective terminal pads. However, this second method has the same defect as that of the first method.

A third method is carried out by utilizing an optical detector. In the third method, the optical detector detects the location of the end lead being projected from the corner of the IC package, and the inspector controls the mechanical hand so as to move the end lead to a position located right above the corresponding terminal pad. However, this third method has a defect in that it is difficult to achieve highly accurate alignment between the remaining leads and the remaining terminal pads. This is because, although the end lead, which acts as a scale for alignment, must be projected straight along a line from the IC package, this end lead is often bent and forms a bow due to the mechanical impact during, for example the transport of the IC package.

A last method is the so-called pattern-matching method. In the last method, the destination of the position of each lead is stored, in advance, in a computer storage device. The computer controls the position of each lead so as to coincide the actual present position of each lead with the stored destination of the position of the lead. However, this last method has defects in that, firstly, it is difficult to achieve highly accurate alignment therebetween, because, even though coincidence would have been obtained, the positions of the terminal pads often slightly deviate from the predetermined positions due to a small flexure developed on the printed board because of the variation of atmospheric temperature. Secondly, it is impossible to carry out this last method if the destination of the position of each lead is not prepared and stored, in advance, in the storage device of the computer. This is very time consuming.

SUMMARY OF THE INVENTION

Therefore, it is an object of the present invention to provide a method for achieving alignment between objects to be overlapped with each other, which method produces no defects similar to the above mentioned defects produced from the first through fourth methods of the prior art.

BRIEF DESCRIPTION OF THE DRAWINGS

The present invention will be more apparent from the ensuing description with reference to the accompanying drawings wherein.

DETAILED DESCRIPTION OF THE PREFERRED EMBODIMENTS

Figure 1:
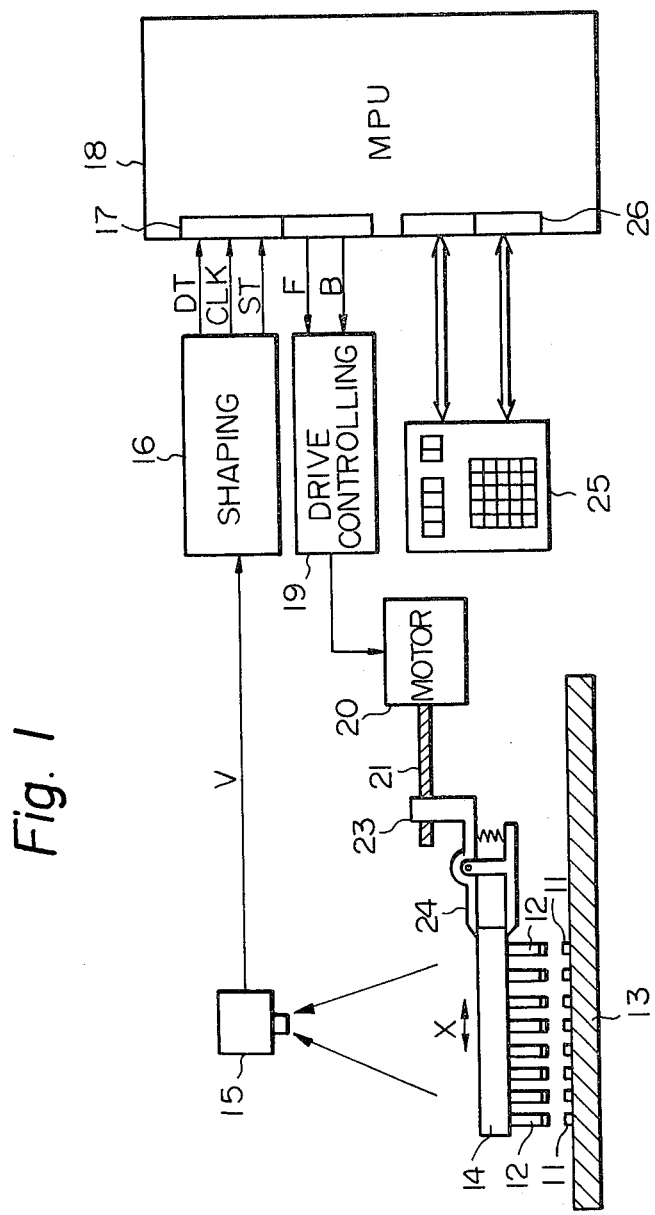
FIG. 1 schematically illustrates a general view of a positioning and installation system adapted to carry out a method of a first embodiment of the present invention.

In FIG. 1, which schematically illustrates a general view of a positioning and installation system adapted to carry out a method of a first embodiment according to the present invention, the reference numeral 11 represents, in general, a first object to be aligned, for example a terminal pad. The reference numeral 12 represents, in general, a second object to be aligned with the first object. The second object is, for example a lead of an IC package. A plurality of terminal pads 11 are mounted on a printed board 13. A plurality of leads 12 project from the IC package 14. A sensor camera 15 is fixedly located directly above both the terminal pads 11 and the leads 12. A video signal V produced from the camera 15 is applied to a wave shaping circuit 16 and is transformed into a square-wave signal therein. The square-wave video signal produced from the circuit 16 is supplied, as a digital data DT, to an input stage of microprocessor unit (MPU) 18. The microprocessor unit 18 and the circuit 16 are coupled to each other via a conventional input/output interface 17. The circuit 16 can produce a clock signal CLK and also a start signal ST besides the digital data DT. The microprocessor unit 18 stores the data DT therein and processes the data DT in accordance with the first method of the present invention. Then the resulting data obtained through the process of the unit 18 is supplied, as a forward movement signal F and a backward movement signal B, to a drive controlling circuit 19 via the interface 17. The circuit 19 controls the IC package 14 together with the leads 12 to move forward or backward along the direction of arrow X, in accordance with the signal F or the signal B, by means of a pulse motor (MOTOR) 20, a threaded driving shaft 21, a ball-nut means 23 and a gripping means 24 provided with a tension spring. The IC package 14 is moved along the direction of the arrow X until each of the leads 12 is correctly aligned with each of the corresponding terminal pads 11. Finally, the IC package 14 together with the leads 12 is moved downward so as to correctly join with the respective terminal pads 11, and the leads 12 and terminal pads 11 are soldered so that the leads 12 are fixed to the respective terminal pads 11. The predetermined programs are transmitted to the unit 18 from a keyboard 25 via an input/output interface 26.

Figure 2:
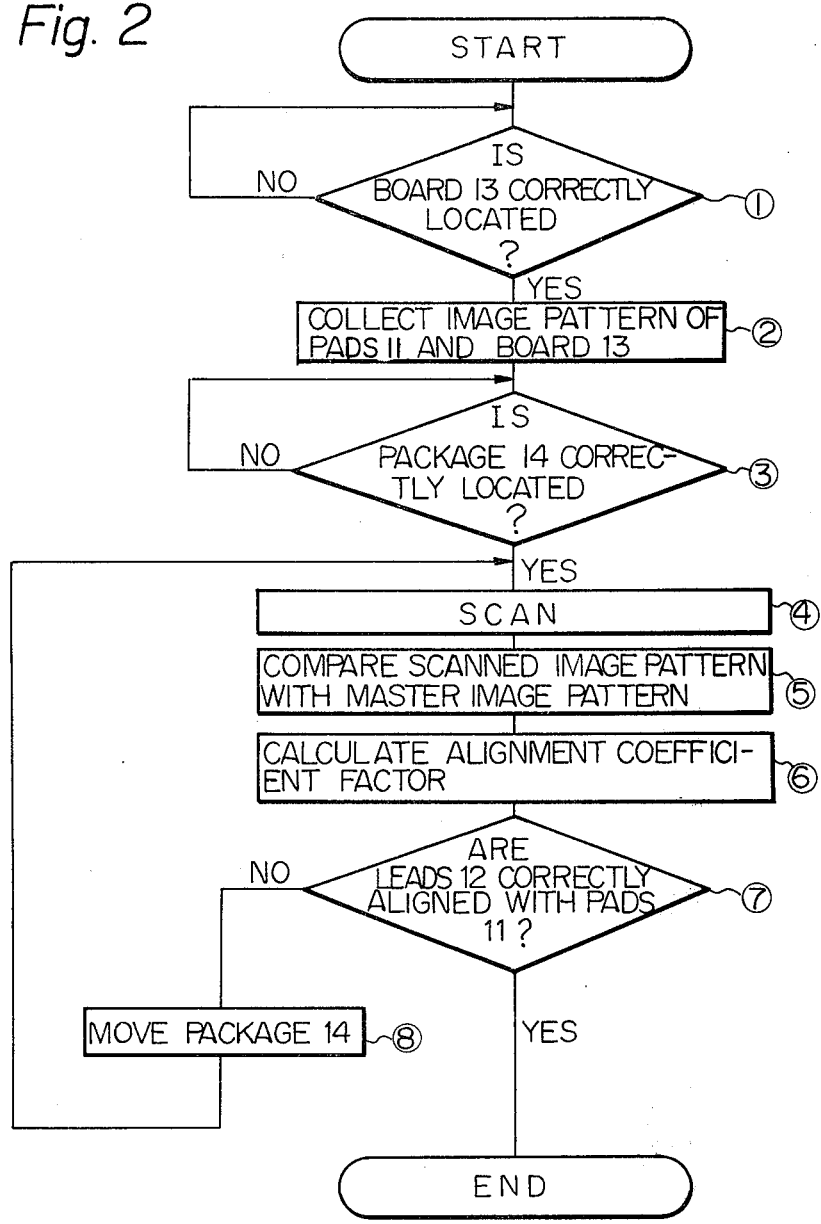
FIG. 2 depicts a flowchart used for explaining the processes for carrying out the method according to the present invention.
Figure 3A:
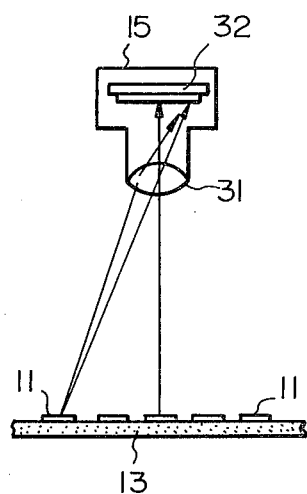
FIG. 3A illustrates a front view of the sensor camera 15 and terminal pads 11 mounted on the printed board 13 shown in FIG. 1.
Figure 3B:
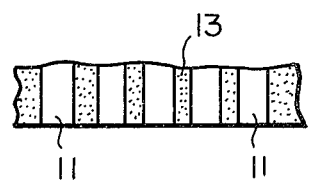
FIG. 3B illustrates a partial plan view of the terminal pads 11 mounted on the printed board 13 shown in FIG. 3A.

Now the operation of the first method of the present invention will be explained hereinafter, with reference to FIGS. 2, 3A, 3B, 4A, 4B and 5. In FIG. 2, which depicts the flowchart of the processes for carrying out the first method of the present invention, the reference numeral ① denotes a process in which the printed board 13 together with the terminal pads 11 is moved so that the terminal pads 11 come within the field of view of the sensor camera 15. That is, the process ① determines whether or not the printed board 13 is correctly located at a desired position ("IS BOARD 13 CORRECTLY LOCATED?"). This process ① can be achieved by utilizing the so-called limit switch (not shown in FIG. 1), where the printed board 13 is moved until the board 13 abuts the limit switch. At the end of the process ①, the terminal pads 11 on the board 13 and the sensor camera 15 are positioned in an arrangement as shown in FIG. 3A which illustrates a front view of the sensor camera 15 and the terminal pads 12 mounted on the printed board 13 shown in FIG. 1. FIG. 3B illustrates a partial plan view of the terminal pads 11 mounted on the printed board 13. As seen from FIG. 3A, the sensor camera 15 is comprised of an optical lens system 31 and a CCD (Charge Coupled Device) 32. An image pattern which is collected by the CCD 32 with the aid of the lens system 31, is the same as the printing pattern shown in FIG. 3B.

A process ② of FIG. 2 denotes the process in which the image pattern created by both the terminal pads 11 and the printed board 13 is collected by the sensor camera 15 ("COLLECT IMAGE PATTERN OF PADS 11 AND BOARD 13"). The collected image pattern is supplied to the wave shaping circuit 16. The circuit 16 produces the digital data DT in the form of logic "0""1" bit data and supplies this to the microprocessor unit 18 (refer to FIG. 1). The digital data DT is stored in a storage device (not shown) of the unit 18, as a collected master image pattern data. The master image pattern data is composed of "0" "1" bit trains. The number of bit trains is, for example 512, when the CCD 32 is fabricated as a 512 bit CCD. Each of the "0" bits of the master image pattern data represents a pattern defined by the printed board area (13) in FIG. 3B. Each of the "1" bits of the master image pattern data represents a pattern defined by the terminal pad area (11) in FIG. 3B. As a result, the master image pattern data having a bit arrangement as shown in a row (a) of FIG. 5, can be obtained. In the row (a) of FIG. 5, each of the "0" bit areas corresponds to the image pattern of the printed board 13, and each of the "1" bit areas corresponds to the image pattern of the terminal pads 11.

Figure 4A:
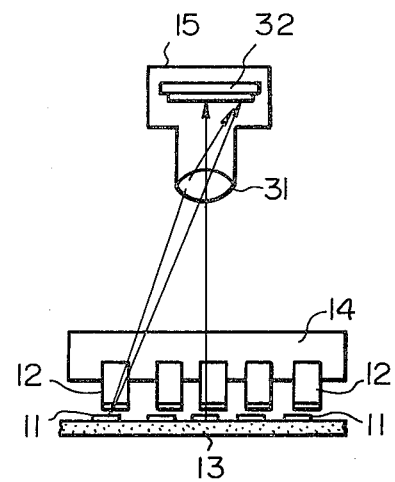
FIG. 4A illustrates a front view of the terminal pads 11 mounted on the printed board 13, the leads 12 projecting from the IC package 14 and the sensor camera 15 shown in FIG. 1.
Figure 4B:
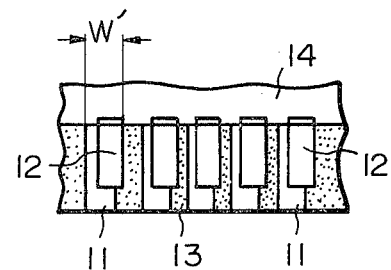
FIG. 4B illustrates a plan view of the terminal pads 11 mounted on the printed board 13 and the leads 12 projecting from the IC package 14 shown in FIG. 4A.

A process ③ of FIG. 2 denotes a process in which the IC package 14 having the leads 12 is moved so that the leads 12 come within the field of view of the sensor camera 15. That is, the process ③ determines whether or not the IC package 14 is correctly located at a desired position ("IS PACKAGE 14 CORRECTLY LOCATED?"). This process ③ can be achieved by utilizing a limit switch (not shown in FIG. 1), where the IC package 14 is moved until the package 14 abuts the limit switch. At the end of the processor ③, the terminal pads 11 mounted on the board, the leads 12 projecting from the IC package 14 and the sensor camera 15 are positioned in such an arrangement as shown in FIG. 4A. FIG. 4A illustrates a front view of the above mentioned members 11, 12, 13, 14 and 15 shown in FIG. 1. FIG. 4B illustrates a partial plan view of the above mentioned members 11 through 14, in which FIG. 4B the members 31 and 32 have already been explained with reference to FIG. 3A. An image pattern which is collected by means of the CCD 32 with the aid of the lens system 31, is the same as the arrangement of both the pads 11 and the leads 12.

A process ④ of FIG. 2 denotes a process in which the IC package 14 together with the leads 12 is moved forward or backward along the direction of arrow X shown in FIG. 1. In other words, the process ④ is a process for conducting a scanning operation "SCAN") by the camera 15. The signal obtained in this scanning process ④ is supplied, as "0" "1" bit data DT, to the microprocessor unit 18 via the wave shaping circuit 16 (refer to FIG. 1). The image pattern data which is obtained in this process ④, is hereinafter referred as scanned image pattern data. This scanned image pattern data is different from the aforesaid master image pattern data collected in the process ② of FIG. 2. At first, the leads 12 are not yet correctly aligned with the terminal pads 11, as shown in FIGS. 4A and 4B, and accordingly the scanned image pattern data having a bit arrangement as shown in a row (b) of FIG. 5, may be obtained. The number of bits "1" shown in this row (b) is larger than the number of bits "1" shown in the row (a) of FIG. 5. This is because the bits "1" corresponding to the leads 12 partially enter into the "0" bit areas corresponding to the areas 13. However, when the leads 12 are correctly aligned with the terminal pads 11 during the scanning process ④ of FIG. 2, the number of bits "1" shown in row (b) of FIG. 5 becomes equal to the number of bits "1" shown in row (a). Thus, it should be understood that when the total number of bits "1" of the scanned image pattern data i.e. the total length (see the row (b) of FIG. 5), reaches a minimum value during the scanning process ④ of FIG. 5, this indicates, from another view point, that the leads 12 are correctly aligned with the terminal pads 11. Consequently, at this time, the operation for achieving the alignment is completed. In this case, no bit "1" corresponding to the pattern data of each lead 12, enters into "0" bit areas 13 shown in the raw (a) of FIG. 5.

The principle of the first method according to the present invention has been explained by the above mentioned operation through the processes ① through ④ of FIG. 2. However, in practical use, a problem often arises when the method for achieving the alignment between objects is carried out in accordance merely with this principle. The problem is that the alignment is not always achieved perfectly without errors. The reason for this is as follows. Generally, since the terminal pads 11 are plated by solder in advance, the strength of the reflected light beam therefrom, is not strong, but is uniform. Therefore, the image pattern data corresponding to the terminal pads 11 which are plated by solder can always be collected as "1" bit data without error. Contrary to the above, generally, since the leads 12 are produced through a pretinning process, the strength of the reflected light beam therefrom, is not uniform, but is strong. Therefore, the image pattern data corresponding to the pretinned leads 12 cannot always be collected as "1" bit data and are often changed to incorrect "0" bit data. This is because the surface of each of the pretinned leads 12 has an area from which the light beam is strongly reflected or an area from which no light beam is reflected. Consequently, the scanned image pattern data having a bit arrangement as shown in row (c) of FIG. 5, may be obtained. In row (c) of FIG. 5, the "0" bits having dots on their tops "0" represent the incorrect "0" bit data which is collected from the areas of the surfaces of the pretinned leads 12 which do not reflect the light beam. It is apparent that, if such incorrect "0" bits are included in the image pattern data, the alignment cannot be achieved with a high degree of accuracy. This is because, although the leads 12 are not aligned correctly with the terminal pads 11, the above mentioned total number of the "1" bits would reach the minimum value due to the presence of the incorrect "0" bits.

In order to resolve the above mentioned problem, it is preferable to introduce a novel alignment coefficient factor F into the system. This factor F is defined by the following equation.

$$F = \sum_{n=1}^{m} (\overline{M}_n \cdot S_n).$$

Figure 5:
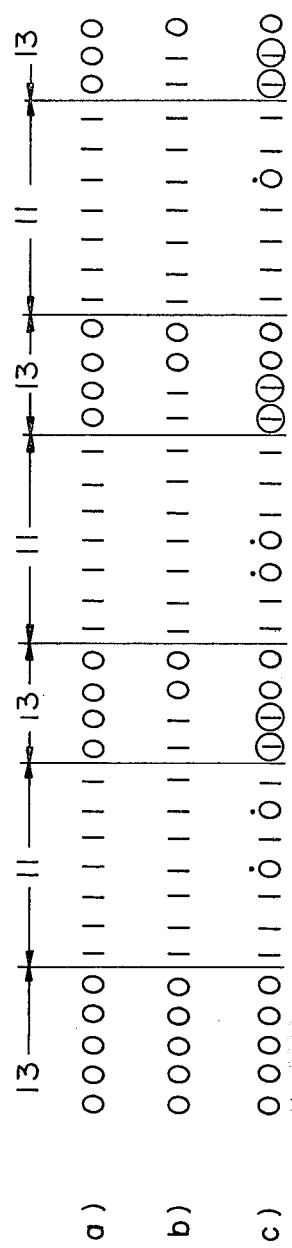
FIG. 5 schematically depicts "0""1" bit patterns of data to be processed, which data are collected by means of the sensor camera 15 shown in FIGS. 3A and 4A.

When the value of this factor F reaches a minimum value, the alignment can be completed without producing any error, even though the incorrect "0" bits are still included in the scanned image pattern data. In the above equation $$F = \sum_{n=1}^{m} (\overline{M}_n \cdot S_n),$$

the symbol $\overline{M}_n$ denotes the inverted bit data of the n-th bit in the master image pattern data (see row (a) of FIG. 5). Accordingly, the logic of $\overline{M}_n$ becomes "1" only when the n-th bit data is logic "0". Specifically, only the logic of $\overline{M}_n$ corresponding to the "0" bit areas 13 in the master image pattern data becomes "1". While the symbol $S_n$ denotes the bit data of the n-th bit in the scanned image pattern data, only the logic of $S_n$ corresponding to the "1" bit areas 11 becomes logic "1". All of the logical products of $\overline{M}_n$ and $S_n$, that is $(\overline{M}_n \cdot S_n)$, are summed up from 1 to m, that is $$\sum_{n=1}^{m} (\overline{M}_n \cdot S_n).$$

According to the aforementioned example, the value of m equals 512, when the CCD 32 is fabricated as a 512 bit CCD whole image pattern. Thus, the factor F indicates the total number of "1" bits which appear in the "0" bit areas 13 shown in row (a) of FIG. 5. Such "1" bit data are specifically referred to as 1 surrounded by circles, that is ①, in row (c) of FIG. 5. Therefore, the method for achieving alignment can be conducted irrespective of the presence of the incorrect "0" bit data which is shown as 0 in the row (c) of FIG. 5.

A process ⑤ of FIG. 2 denotes a process in which an operation for comparing the master image pattern data ($\overline{M}_n$) with the scanned image pattern data ($S_n$) sequentially bit by bit is conducted ("COMPARE SCANNED IMAGE PATTERN WITH MASTER IMAGE PATTERN"). The master image pattern data has been collected during the process ② of FIG. 2 and stored in the microprocessor unit 18 (see FIG. 1). Accordingly, in the process ⑤, the operation is carried out based on the logical product of ($\overline{M}_n \cdot S_n$). A process ⑥ of FIG. 2 denotes a process in which the value of the factor F is calculated ("CALCULATE ALIGNMENT COEFFICIENT FACTOR"). A process ⑦ denotes a process in which the IC package 14 is moved forward and backward along the direction of the arrow X (see FIG. 1) so as to make the value of said factor F a minimum value, so that the leads 12 are correctly aligned with the terminal pads 11 ("ARE LEADS 12 CORRECTLY ALIGNED WITH PADS 11?") through a process ⑧ of FIG. 2. In process ⑧ the IC package 14 is moved forward and backward ("MOVE PACKAGE 14"). Then the operation for achieving alignment with regard to one IC package will be finished ("END").

Figure 6:
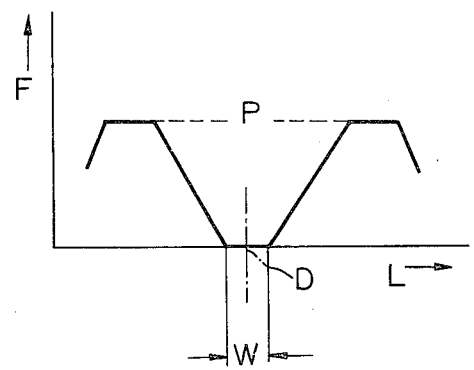
FIG. 6 is a graph which schematically depicts the relationship between an alignment coefficient factor F and a displacement L.
Figure 7:
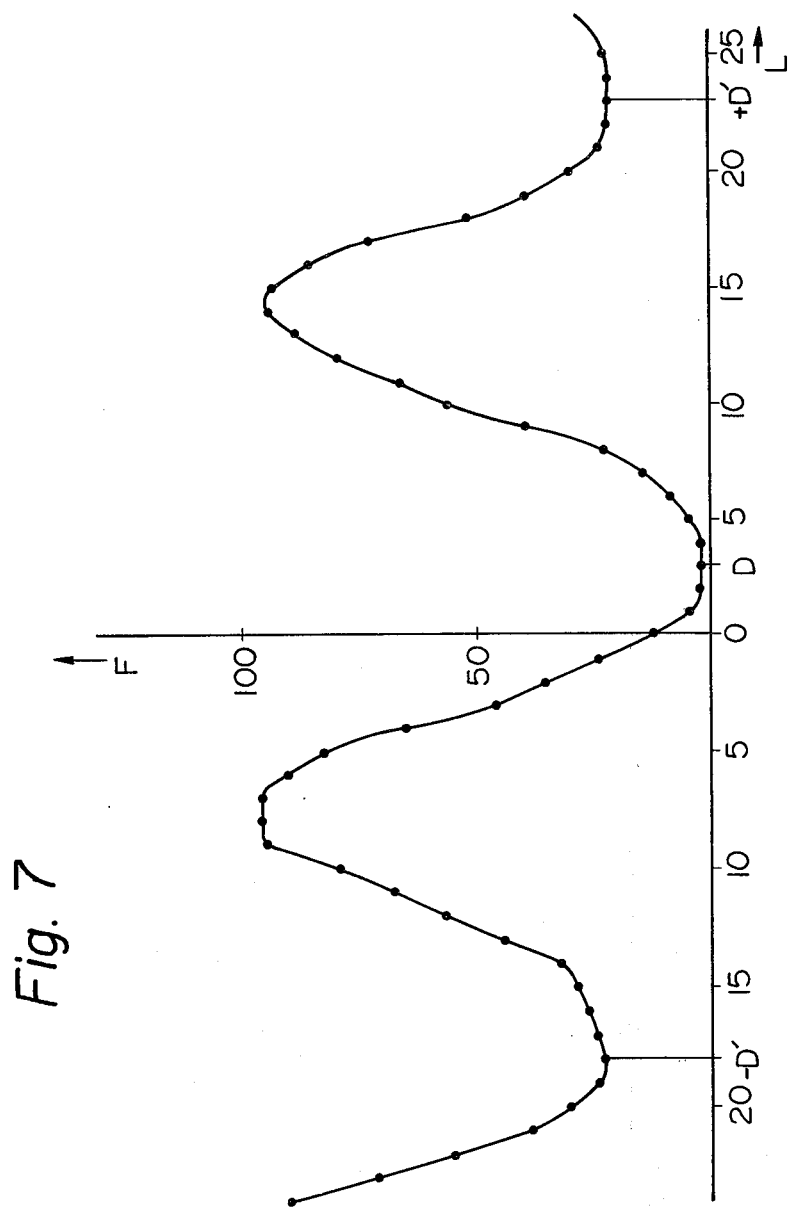
FIG. 7 is a graph which depicts the actual relationship which is obtained from the results of experimental data between the factor F and the displacement L.

The alignment coefficient factor F will be explained in detail with reference to FIGS. 6 and 7. FIG. 6 is a graph which schematically depicts the relationship between the variables F and L, where F is the above mentioned factor and L is a displacement value of the IC package 14. The symbol D denotes a position of the destination to which the IC package must be transferred so as to align the leads 12 with the respective pads 11. At this destination D, the factor F becomes substantially equal to zero, however the factor F does not become exactly equal to zero due to the presence of an optical noise signal and an electric noise signal. The value of the factor F gradually increases when the IC package 14 deviates from the destination D, and finally the value of the factor F is saturated at the constant maximum level P. The maximum level P is obtained in a case where the leads 12 are located at the middle of areas which exist between respective two adjacent pads 11. In other words the leads 12 are located not above the pads 11, but right above respective printed board areas 13. As seen from FIG. 6, the factor F becomes substantially equal to zero not only at the destination D, but also within a range represented by the symbol W. If the width of each lead 12 is equal to or wider than that of each pad 11, the factor F becomes substantially equal to zero only at the destination D. However, since the width of each lead 12 is usually designed to be narrower that that of each pad 11, the factor F is kept substantially equal to zero so long as each lead 12 is located directly above each pad 11 and within the width thereof. Thus, the range W of FIG. 6 is created.

If it is required to align the center of each lead 12 with the center of each pad 11 so as to conduct the alignment with a very high degree of accuracy, the IC package must be moved to the destination D itself during the process ⑦ of FIG. 2. The detection of the destination D can be accomplished by following two steps with the aid of the microprocessor unit 18 (FIG. 1). In the first step, the coordinates of both ends of the range W (FIG. 6) are detected. In the second step, the middle point of the two coordinates detected in the above mentioned first step is calculated. The calculated middle point represents the position of the destination D itself. FIG. 6 is the graph which schematically depicts the relationship between the variables F and L; however, FIG. 7 is a graph which depicts the actual relationship therebetween. This graph is drawn in accordance with the results of experimental data. The experiment for obtaining the relationship shown in FIG. 7 was conducted under the conditions where each lead 12 is 0.2 mil in width, each pad 11 is 0.3 mil in width and the pitch with which the leads 12 are arranged is 20 mil in length and the pitch with which the pads 11 are arranged is also 20 mil. In FIG. 7, the abscissa indicates the displacement L in mils and the ordinate indicates the factor F which is expressed by the number of bits having logic "1". The destination D of FIG. 7 is identical with the destination D of FIG. 6. The symbols +D' and −D' denote quasi destinations which will be explained hereinafter.

Figure 8:
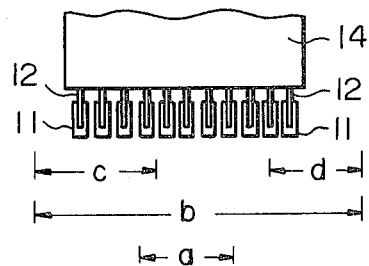
FIG. 8 illustrates a partial plan view of the IC package 14, provided with the leads 12 and the terminal pads 11, used for explaining a particular characteristic introduced into the relationship between the factor F and the displacement L.
Figure 9:
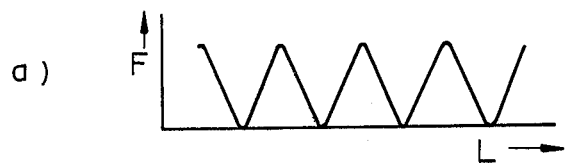
FIG. 9 depicts graphs which indicate the relationship curves between the factor F and the displacement L; the relationships (a), (b), (c) and (d) are obtained when the leads 12 and the pads 11 are scanned along the scanning ranges "a", "b", "c" and "d" shown in FIG. 8, respectively.
Figure 9:
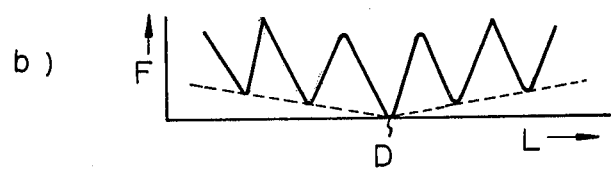
Figure 9:
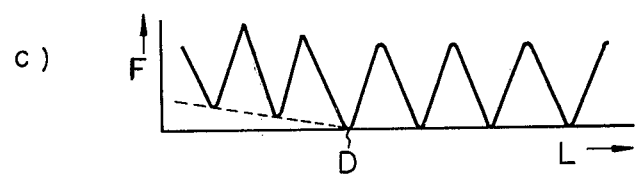
Figure 9:
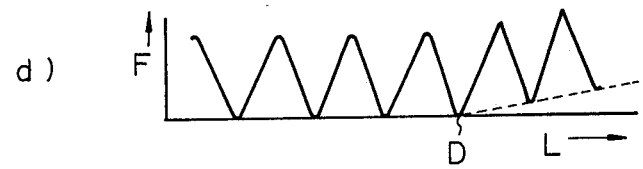

When the above mentioned first method of the present invention is carried out, a further problem other than the previously mentioned problem arises. The problem is that many destinations D are detected during the process ⑦ of FIG. 2. This is because, the leads 12 are aligned with the pads 11 every time the IC package 14 is displaced by k (k=1, 2, 3 ...) times the pitch with which the leads 12 and the pads 11 are arranged. Therefore, it is necessary to move the IC package 14 toward only one true destination. In order to find the true destination, it is preferable to introduce a particular characteristic into the relationship in addition to the variables F and L shown in FIG. 6 or FIG. 7. The particular characteristic will be explained with reference to FIGS. 8, 9, 10A, 10B, 10C and 11. FIG. 8 illustrates a partial plan view of the IC package 14 provided with the leads 12 and also the terminal pads 11, used for explaining the creation of the above mentioned particular characteristic. In a case where the sensor camera 15 (FIG. 1) scans the leads 12 and the pads 11 along a scanning range "a" of FIG. 8, the relationship curve as shown in row (a) of FIG. 9 is obtained. It should be noted that all the relationship curves shown in FIG. 9 are obtained by moving the IC package 14 leftward or rightward with respect to the terminal pads 11. As seen from the curve shown in the row (a), this curve is a repetitive curve and includes no particular characteristic. Therefore many destinations similar to the destination D shown in FIG. 6 are detected, and accordingly it is impossible to find the one true destination D. The above mentioned problem specifically resides in this fact. In order to resolve this problem, according to the present invention, the camera 15 (FIG. 1) scans along a particular scanning range such as shown by scanning ranges "b", "c" or "d" in FIG. 8. In a case where the camera 15 scans all of the leads 12 and pads 11 along the scanning range "b" of FIG. 8, the particular characteristic appears in the relationship curve as shown in row (b) of FIG. 9. If the IC package 14 deviates leftward from the arrangement of leads 12 and pads 11 shown in FIG. 8, the relationship curve extends toward the top left of the graph shown in the row (b). If the IC package 14 deviates rightward from the arrangement of the leads 12 and pads 11 shown in FIG. 8, the relationship curve extends toward the top right of the graph shown in row (b). Therefore, the V-shaped dotted lines express the above mentioned particular characteristic. Thus, the destination D is presented at the bottom of the relationship curve. In a case where the camera 15 scans two adjacent ends of the leads 12 and pads 11 along the scanning line "c" or "d" of FIG. 8, the particular characteristic appears in the respective relationship curve as shown in row (c) or row (d) of FIG. 9 (see respective dotted lines). Therefore, the true destination D is presented at the point from which the relationship curve increases toward the top left or top right of the graph shown in the row (c) or row (d) of FIG. 9, respectively.

Figure 10A:
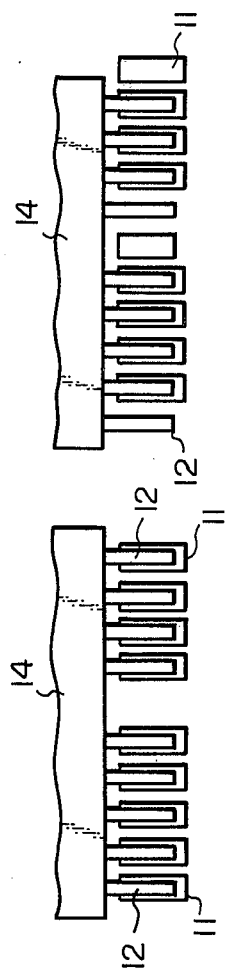
FIG. 10A, FIG. 10B and FIG. 10C illustrate partial plan views of the leads 12 and the pads 11 which include irregular portions therein.
Figure 10B:
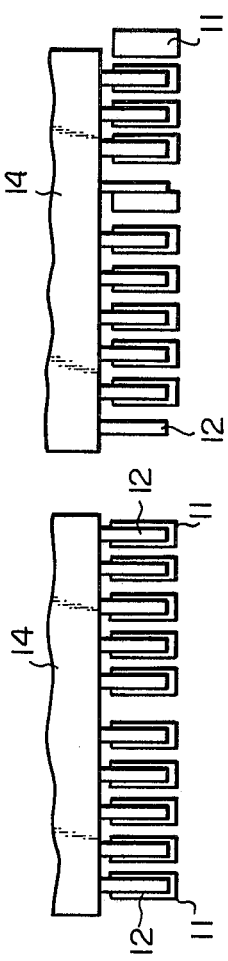
Figure 10C:
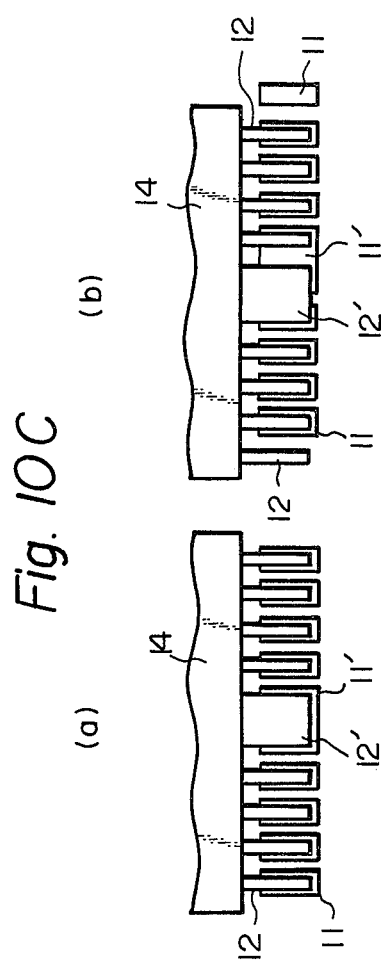
Figure 11:
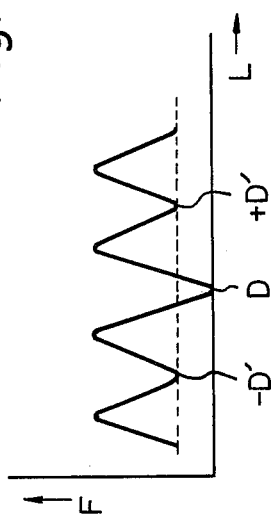
FIG. 11 is a graph which depicts a relationship curve between the factor F and the displacement L; the graph is obtained by using the arrangement of the leads 12 and the pads 11 shown in any one of FIGS. 10A, 10B and 10C.

The particular characteristic of the relationship curve can also be created by fabricating the leads 12 and pads 11 with a special arrangement. Three examples of special arrangements are illustrated in FIGS. 10A, 10B and 10C. Each of FIGS. 10A, 10B and 10C illustrates a plan view of the leads 12 and the terminal pads 11. In a first example, referring to FIG. 10A, one of the leads 12 is removed from the IC package 14 and also the corresponding one of the pads 11 is removed from the printed board. In a second example, referring to FIG. 10B, one of the leads 12 is removed from the IC package 14 and also the corresponding one of the pads 11 is removed from the printed board. However, the width of the removed area shown in FIG. 10B is selected to be narrower than that of the removed area shown in FIG. 10A for economical purposes. In a third example, referring to FIG. 10C, one of the leads 12 is wider than the remaining leads 12, as shown by wide lead 12'. A terminal pad corresponding to the wide lead 12' is also wider than the remaining terminal pads 11 as shown by wide terminal pad 11'. Thus, the leads 12 include at least one irregular portion and also the terminal pads 11 include at least one irregular portion. The relationship curve obtained by utilizing either one of the above mentioned irregular portions becomes a relationship curve such as shown in FIG. 11. In this case, the camera 15 scans the leads 12 and the pads 11 along the scanning range "a" shown in FIG. 8. As seen from FIG. 11, the true destination D is apparently differentiated from other quasi destinations −D' and +D' which are also shown in FIG. 7. When the leads 12 and pads 11 are located with a normal arrangement, such as shown in each part (a) of FIGS. 10A, 10B and 10C, the true destination D can be detected. However, when the IC package 14 is located at a different position from the desired position by k (k=1, 2, 3 ...) times the pitch with which the leads 12 and also the pads 11 are arranged, the quasi destination −D' or +D' will be detected. In this case, the leads 12 and the pads 11 are located with an abnormal arrangement, such as shown in each part (b) of FIGS. 10A, 10B and 10C.

It is preferable to fabricate any one of the above mentioned irregular portions at the middle area of one group of leads 12 and also at the middle area of one group of terminal pads 11. This is because these middle areas are not as likely to be damaged from external mechanical impact. Further, it is preferable, in the third example, to fabricate the wide lead 12' and the wide terminal pads 11', because they can also be used as ground terminals or power supply terminals, through which terminals a current having very large magnitude flows. Thus, it is preferable to create at least one irregular portion in the group of leads 12 and also in the group of pads so as to obtain the particular characteristic shown in FIG. 11.

Figure 12:
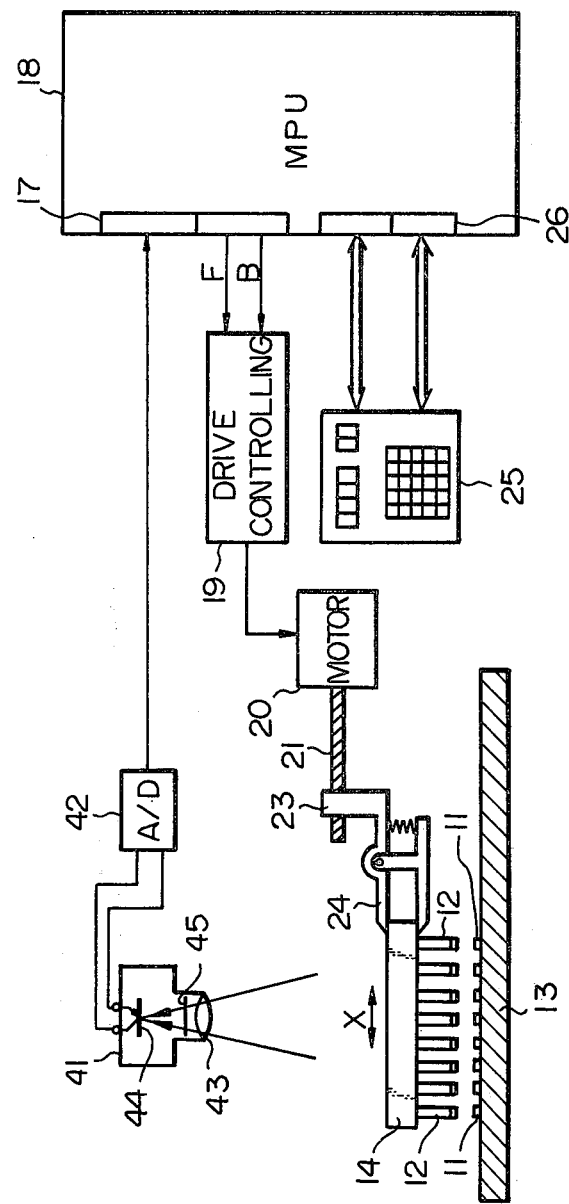
FIG. 12 schematically illustrates a general view of a positioning and installation system adapted to carry out a method of a second embodiment of the present invention.
Figure 13:
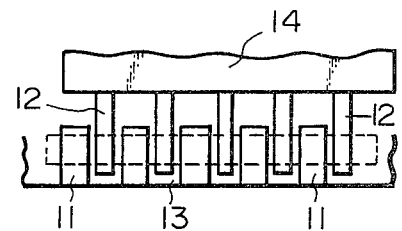
FIG. 13 illustrates partial plan views of the IC package 14 provided with the leads 12 and the terminal pads; the views are used for explaining the second method of the present invention.
Figure 13:
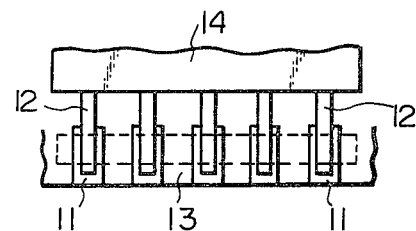
Figure 14:
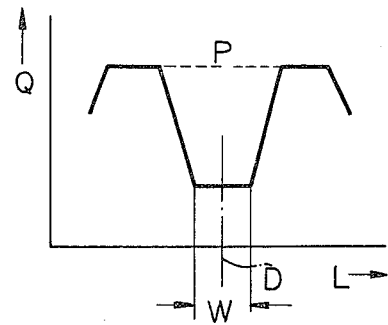
FIG. 14 is a graph which schematically depicts the relationship between a quantity of light Q and a displacement.

The above mentioned first method of the present invention is carried out under the so-called digital mode. In contrast, a method for achieving alignment is a second embodiment of the present invention, is carried out under the so-called analogue mode. In the second method of the present invention, the above mentioned relationship is defined not by the alignment coefficient factor F, but by the quantity of light reflected from both the leads 12 and the pads 11. In FIG. 12, which schematically illustrates a general view of a positioning and installation system adapted to carry out the method of the second embodiment, of the present invention, the members represented by the same reference numerals or symbols as shown in FIG. 1 are identical with each other. Therefore, a sensor camera 41 and an analogue/digital converter (A/D) 42 are the newly employed members. The camera 41 is comprised of an optical lens system 43 and a phototransistor 44. Generally, the quantity of light reflected from both the leads 12 and the pads 11 is large; however the quantity of light reflected from the printed board 13 is small. The total quantity of light is detected by the phototransistor 44 via the lens 43. In a case where the leads 12 and the pads 11 are located with an abnormal arrangement, such as is shown in part (a) of FIG. 13, the total quantity of light reflected from the leads 12, the pads 11 and the printed board 13 becomes a maximum value. However, in a case where the leads 12 and the pads 11 are located with a normal arrangement such as is shown in part (b) of FIG. 13, the total quantity of light becomes a minimum value. When the IC package 14 is moved leftward or rightward, the variation of the total quantity of the reflected beam is detected by the phototransistor 44 (FIG. 12). When the analogue output signal from the phototransistor 44 creates the relationship curve as shown in the graph of FIG. 14. The center located in the bottom of this relationship curve represents the destination D, which has already been explained. Since each of the widths of the leads 12 is narrower than each of the widths of the pads 11, the flat portion W is included in the relationship curve at the bottom. The digital signal which represents the relationship curve of FIG. 14 is produced by means of the analogue/digital converter 42 and is applied to the microprocessor unit 18 (FIG. 12). The unit 18 processes the digital signal so as to detect the flat portion of the relationship curve including the destination D. If it is required to align the center of each lead 12 with the center of each pad 11 so as to conduct the alignment with a very high degree of accuracy, the IC package 14 must be moved toward the destination D itself. The detection of the destination D itself can be accomplished, as previously mentioned, with the aid of the unit 18. The unit 18 detects the respective coordinates of both ends of the flat range W (FIG. 14) and calculates the middle point of the above mentioned two coordinates. The destination D is located at this middle point.

It should be understood that the alignment can also be achieved by utilizing the maximum quantity of the reflected light (refer to maximum level P shown in FIG. 14). The maximum quantity of the reflected beam (P) is obtained when the leads 12 and the pads 11 are located with such an arrangement as shown in the part (a) of FIG. 13. Therefore, the leads 12 and the pads 11 will be aligned with each other by moving the IC package 14 by half of the pitch with which the leads 12 and also the pads 11 are arranged. The movement of the IC package 14 by half of the pitch may be conducted with the aid of the microprocessor unit 18. The movement of the IC package 14 from the level P (FIG. 6) by half of the pitch is also applicable in the above mentioned first method.

It should further be understood that since the quantity of light is proportional to the areas of the leads 12 and the pads 11 which reflect the light beam, it is necessary to limit the field of view seen from the camera 41 (FIG. 12). In FIG. 13, the enclosures indicated by the dotted lines schematically represent the limited field of view seen from the camera 41. The limitation of the field of view can be performed by suitably selecting the multiplying factor of the optical lens system 43 (FIG. 12). Also such limitation of the field of view can be performed by employing a plate 45 (FIG. 12) which is provided with a rectangular slit (not shown) therein.

Figure 15:
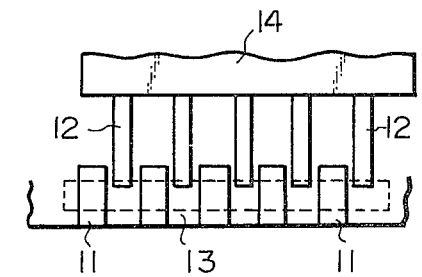
FIG. 15 illustrates partial plan views of the IC package 14, provided with the leads 12 and the terminal pads; these views are also used for explaining the second method of the present invention.
Figure 15:
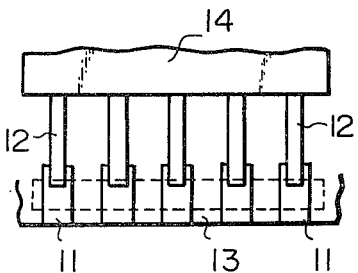

The second method has an advantage in that it is also possible to detect whether or not the IC package 14 is located close to the pads 11. This advantage will be clarified with reference to FIG. 15. If the IC package 14 is not located close to the pads 11, as shown in FIG. 15, the difference between the quantity of light detected through the limited field of view obtained in the arrangement shown in a part (a) and the quantity of light detected through the same obtained in the arrangement shown in a part (b), is very small. The limited field of views are indicated by dotted lines. Thus, it can also be detected that the IC package 14 is not located close to the pads 11.

It is, of course, preferable to introduce the extra characteristic into the relationship curve (FIG. 14) so as to eliminate the misalignment, as is done in the first method. The extra characteristic has already been explained with reference to FIGS. 8, 9, 10A, 10B, 10C and 11.

Figure 16:
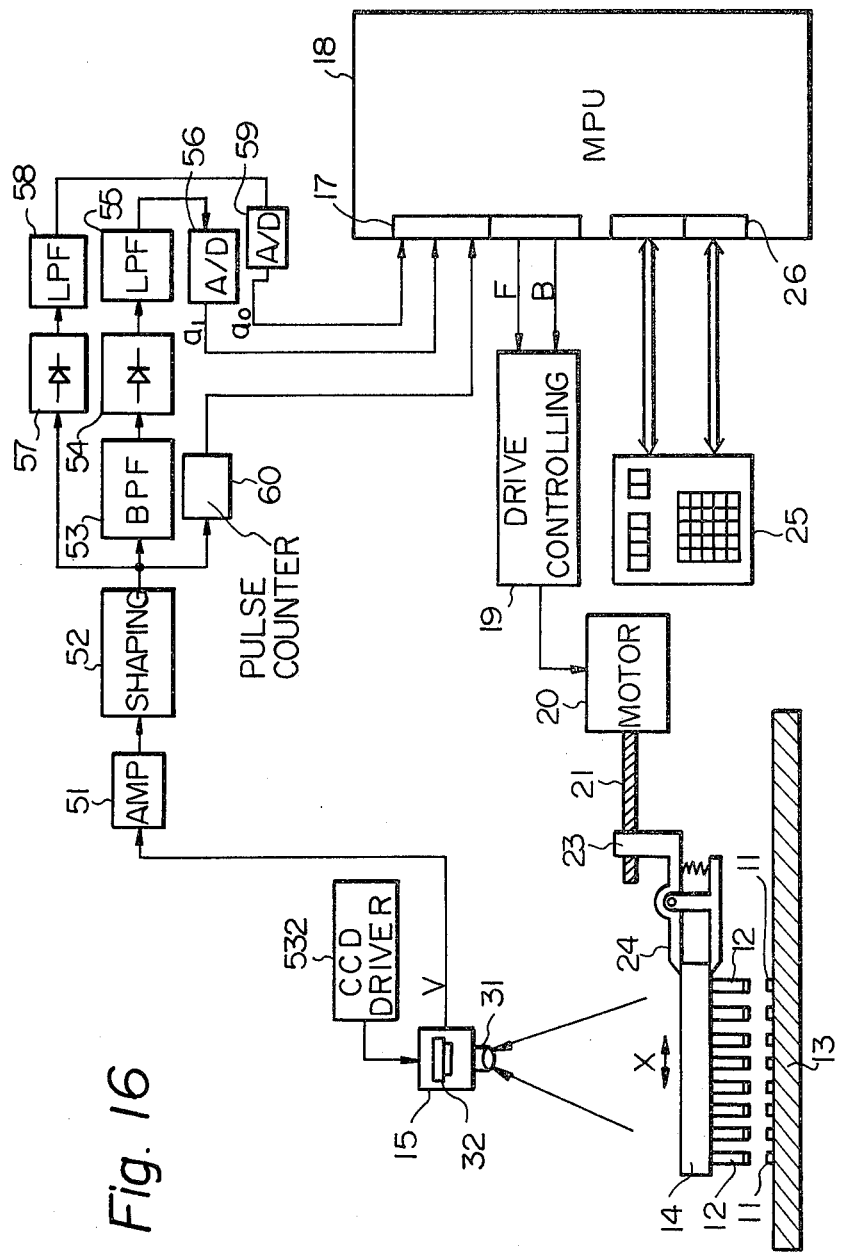
FIG. 16 schematically illustrates a general view of a positioning and installation system adapted to carry out a method of a third embodiment of the present invention.
Figure 17:
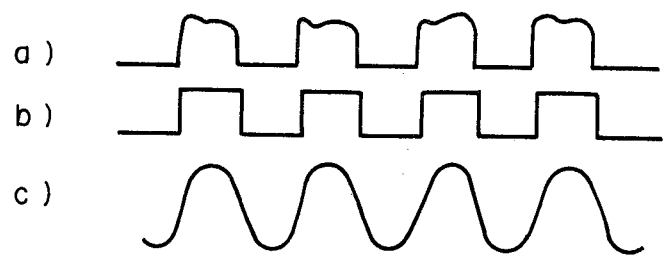
FIG. 17 depicts waveforms of signals appearing in the system shown in FIG. 12.

The above mentioned first method of the present invention is carried out by utilizing the variables regarding the lengths of the leads and the pads. The above mentioned second method of the present invention is carried out by utilizing the variables regarding the area of the leads and pads. However, a method of a third embodiment according to the present invention is carried out by utilizing the variables regarding a frequency spectrum contained in the output signal from the sensor camera 15. In FIG. 16, the video signal V which is simplified by an amplifier (AMP) 51 has a waveform as shown in row (a) of FIG. 17. The amplified video signal V which is produced from a wave shaping circuit 52 has a waveform as shown in row (b) of FIG. 17. The wave shaped signal which is produced from a band pass filter 53 has a waveform as shown in row (c) of FIG. 17. The filter 53 functions to extract only the fundamental wave component from the signal V. This fundamental wave component has a frequency of $f_{BPF}$. The frequency $f_{BPF}$ is expressed by the following evaluation, $$f_{BPF} = V'/P'[Hz] \qquad (1)$$

where the symbol $V'$ denotes a scanning speed of the CCD 32 which is driven by a CCD driver 532, and the symbol $P'$ denotes a pitch with which the leads 12 and also the pads 11 are arranged. If the loss developed in the passband of the filter 53 is equal to zero, the output signal from the filter 53 corresponds to a signal which will be obtained when the number (n) of the order of a harmonic in the Fourier series is equal to 1, that is n=1. On the other hand, regarding in general, a square wave signal, as shown on the upper part in FIG. 18, the spectrum $a_1$ of the fundamental wave, which is contained in the above mentioned square wave signal, can be expressed by the following evaluation.

$$a_1 = 2/\pi \cdot \sin \pi/T \cdot \tau \qquad (2)$$

$(0 \leq \tau \leq T$ and $0 \leq \tau/I \leq 1)$

Figure 18:
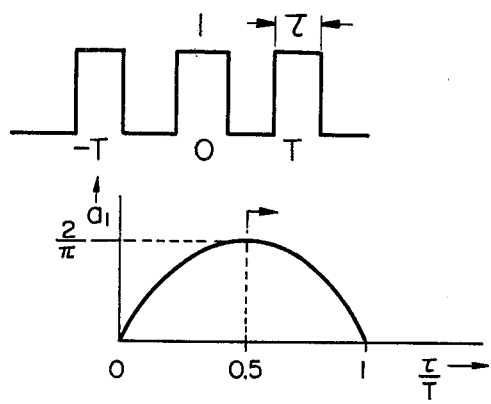
FIG. 18 depicts both a waveform and a graph used for explaining the third method of the present invention.

Regarding the pitch $P'$ and the width $W'$, the value of $W'/P'$ varies within the range of $0.5 \leq W'/P' \leq 1$, where the width $W'$ is defined by the distance between one end of the lead 12 and one end of the corresponding pad 11 (refer to $W'$ shown in FIG. 4B), and the value $W'/P'$ can be substituted for the value of $\tau/T$, that is $W'/P' = \tau T$. The symbol $\tau$ denotes a pulse width of the square signal and the symbol T denotes a period thereof (refer to FIG. 18). When the value of $W'/P'$ becomes a minimum value, the leads 12 are correctly aligned with the respective pads 11. In this case, it is, of course, that the value of $\tau/T$ may become a minimum value. The value of $\tau/T$ becomes a minimum value when the value of $\tau/T$ varies within the range of $0.5 \leq \tau/T \leq 1$, as shown in FIG. 18, and the fundamental wave component $a_1$ becomes a maximum value. In other words, the IC package 14 is moved until the fundamental wave component becomes equal to the maximum value. In FIG. 16, the component $a_1$ is obtained from the band pass filter 53 via a rectifier circuit 54, a low pass filter (LPF) 55 and an analogue/digital converter (A/D) 56. A mean value $a_0$, that is $a_0 = (2/T) \tau$, is obtained from a wave shaping circuit 52 via a rectifier circuit 57, a low pass filter (LPF) 58 and an analogue/digital converter (A/D) 59. The minimum mean value $a_0$ is useful for achieving alignment only in a case where each lead 12 is wider in width than each pad 11.

Figure 19:
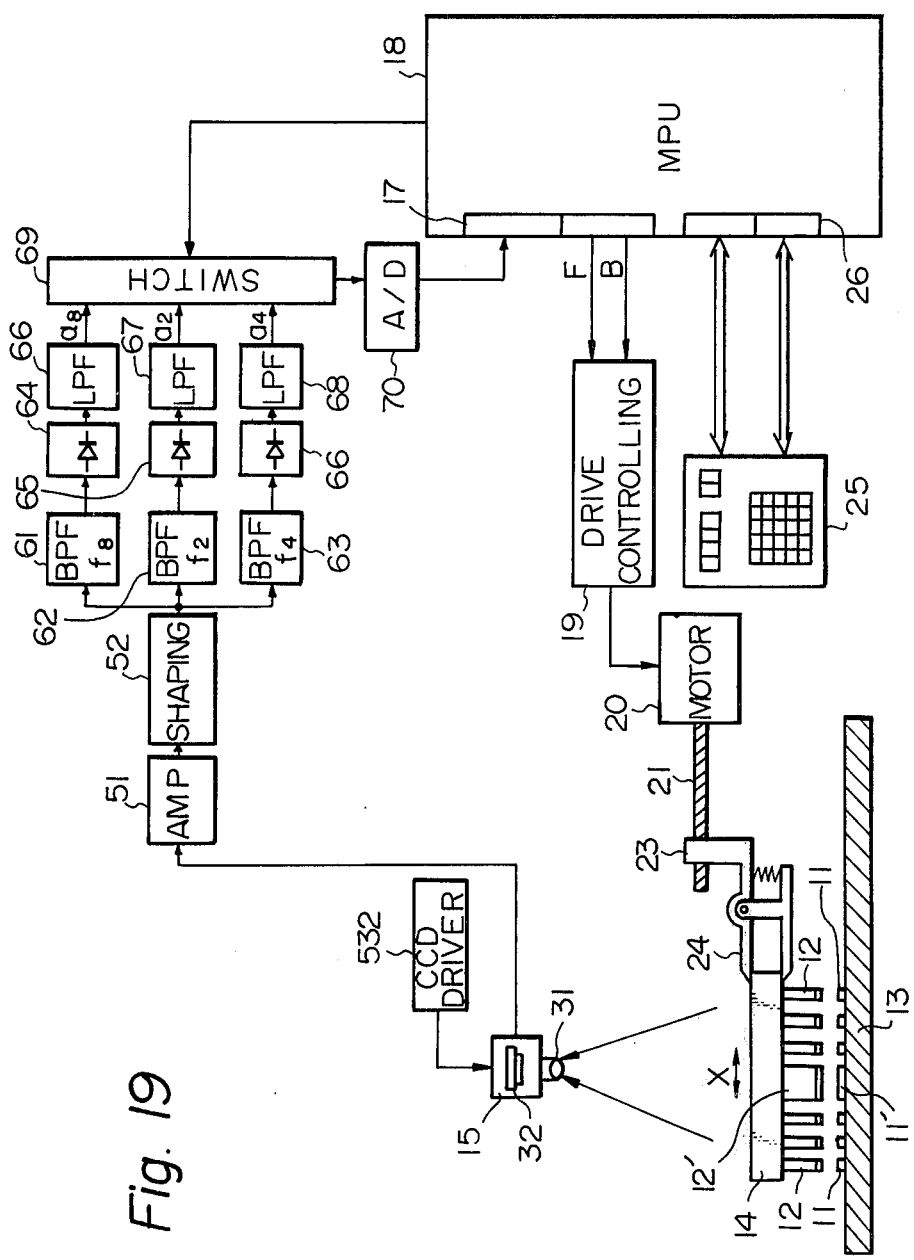
FIG. 19 illustrates a general view of a positioning and installation system adapted to carry out a modified third method according to the present invention.
Figure 20:
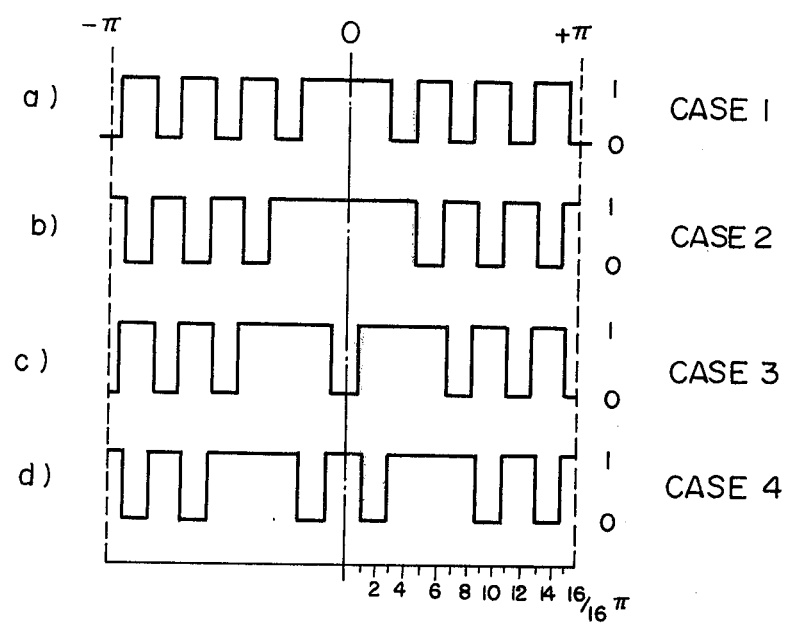
FIG. 20 depicts waveforms of a signal appearing in the system of FIG. 19.

Thus, the microprocessor unit 18 controls the controlling circuit 19 so as to make the value of the fundamental wave component maximum. The maximum value of the component $a_1$ corresponds to the previously mentioned destination D. It should be noted that, in the third embodiment, many destinations D are also detected, as in the aforesaid first and second method, although there is only one true destination. This is because the leads 12 are aligned with the pads 11 every time the IC package 14 is displaced by k (k=1,2,3 ...) times of the pitch with which the leads 12 and also the pads 11 are arranged. Therefore, a pulse counter 60 is employed in the system of FIG. 16, which pulse counter supervises a protrusion of one or more leads 12 from the pad region. The counter counts the number of protrusions and the counted number is compared with a predetermined reference value, so as to supervise whether or not the leads are provided from the pads. However, in a modified third method, the wide lead 12' and the wide pad 11', which have already been explained with reference to FIG. 10C, are employed in the system. The system which employs the wide lead 12' and the wide pad 11', is schematically illustrated in FIG. 19. In FIG. 19, the members which are represented by the same reference numerals or symbols shown in FIG. 16, are identical with each other. In FIG. 19, the CCD 32 scans the leads 12 including the wide lead 12' and the pads 11 including the wide pad 11'. The scanning range of the CCD 32 is the same as the scanning range "a" shown in FIG. 8. The output signal of the CCD 32, via the amplifier 51 and the shaping circuit 52, will now be explained. FIG. 20 depicts waveforms of the output signal of the CCD 32 obtained from the circuit 52. The waveform of the signal shown in a row (a) of FIG. 20 indicates a normal waveform, which is detected when the leads 12 are correctly aligned with the pads 11 (hereinafter referred to as "CASE 1"). The waveforms of the signal shown in rows (b), (c) and (d) of FIG. 20, indicate abnormal waveforms, which are detected when the leads 12 are not correctly aligned with the pads 11 (hereinafter referred to as "CASE 2", "CASE 3" and "CASE 4", respectively). According to the waveforms of FIG. 20, the value $a_n$, in CASE 1, is obtained from the following equations, where the symbol $a_n$ denotes a component of n-th order of a harmonic (n=1,2,3 ...).

$$a_n = \frac{2}{\pi}\left\{\int_0^{\frac{3}{16}\pi} \cos nx\, dx + \int_{\frac{5}{16}\pi}^{\frac{7}{16}\pi} \cos nx\, dx + \int_{\frac{9}{16}\pi}^{\frac{11}{16}\pi} \cos nx\, dx + \int_{\frac{13}{16}\pi}^{\frac{15}{16}\pi} \cos nx\, dx\right\}$$

$$= \frac{2}{\pi}\left\{\left[\frac{1}{n}\sin nx\right]_0^{\frac{3}{16}\pi} + \left[\frac{1}{n}\sin nx\right]_{\frac{5}{16}\pi}^{\frac{7}{16}\pi} + \left[\frac{1}{n}\sin nx\right]_{\frac{9}{16}\pi}^{\frac{11}{16}\pi} + \left[\frac{1}{n}\sin nx\right]_{\frac{13}{16}\pi}^{\frac{15}{16}\pi}\right\}$$

$$= \frac{2}{n\pi}\left(\sin\frac{3}{16}n\pi + \sin\frac{7}{16}n\pi - \sin\frac{5}{16}n\pi + \sin\frac{11}{16}n\pi - \sin\frac{9}{16}n\pi + \sin\frac{15}{16}n\pi - \sin\frac{13}{16}n\pi\right)$$

The component values $a_n$ regarding the remaining CASES 2 through 4 are also obtained by the equations similar to the above recited equations regarding CASE 1. Now the component values $a_n$ of the CASES 1 through 4 are, respectively, represented by symbols C1, C2, C3 and C4. Then the values C1 through C4 will be expressed by using the Fourier sereis.

In general, according to the Fourier series, a periodic function f(x) can be expressed by the following equation, that is $$f(x) = \frac{a_0}{2} + \sum_{n=1}^{\infty}[a_n \cos nx + b_n \sin nx]$$

where, $$a_0 = \frac{1}{\pi}\int_{-\pi}^{\pi} f(x)\, dx$$

$$a_n = \frac{1}{\pi}\int_{-\pi}^{\pi} f(x) \cos nx\, dx$$

$$b_n = \frac{1}{\pi}\int_{-\pi}^{\pi} f(x) \sin nx\, dx, \text{ and}$$

since each waveform of FIG. 20 is expressed by an even function, the values of $b_n$ and $a_n$ are expressed by, $$b_n = 0, \quad a_n = \frac{2}{\pi}\int_0^{\pi} f(x) \cos nx\, dx.$$

Thus, the components C1, C2, C3 and C4 are expressed by the following equations, respectively.

CASE 1

$$C1 = \frac{2}{n\pi}\left(\sin\frac{3}{16}n\pi + \sin\frac{7}{16}n\pi - \sin\frac{5}{16}n\pi + \sin\frac{11}{16}n\pi - \sin\frac{9}{16}n\pi + \sin\frac{15}{16}n\pi - \sin\frac{13}{16}n\pi\right)$$

CASE 2

$$C2 = \frac{2}{n\pi}\left(\sin\frac{5}{16}n\pi + \sin\frac{9}{16}n\pi + \sin\frac{7}{16}n\pi + \sin\frac{13}{15}n\pi - \sin\frac{11}{16}n\pi - \sin\frac{15}{16}n\pi\right)$$

CASE 3

$$C3 = \frac{2}{n\pi}\left(\sin\frac{7}{16}n\pi - \sin\frac{1}{16}n\pi + \sin\frac{11}{16}n\pi - \sin\frac{9}{16}n\pi + \sin\frac{15}{16}n\pi - \sin\frac{13}{16}n\pi\right)$$

CASE 4

$$C4 = \frac{2}{n\pi}\left(\sin\frac{1}{16}n\pi + \sin\frac{9}{16}n\pi - \sin\frac{13}{16}n\pi + \sin\frac{13}{16}n\pi - \sin\frac{11}{16}n\pi - \sin\frac{15}{16}n\pi\right)$$

Figure 21A:
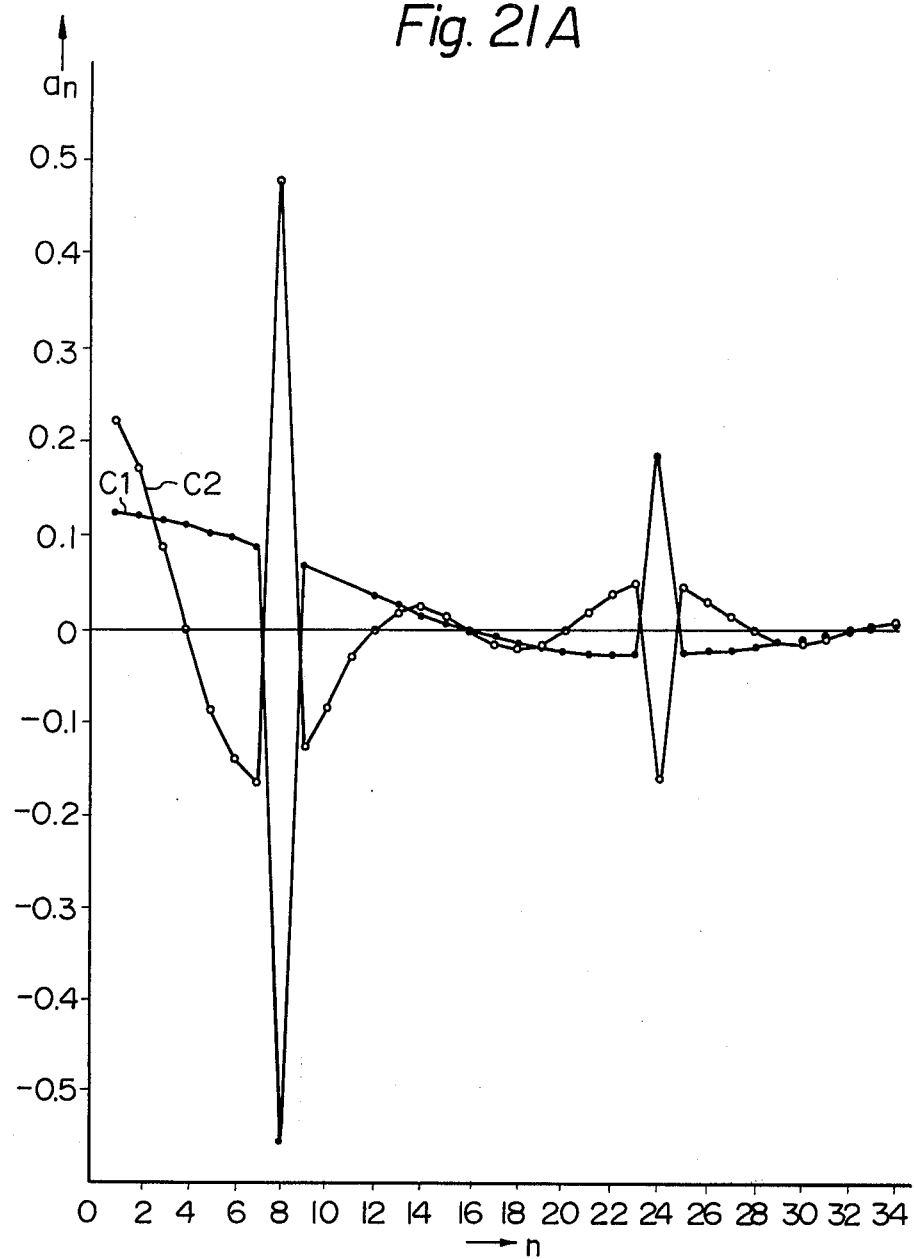
FIGS. 21A and 21B are graphs which depict the relationship curve between a component value $a_n$ and an order n of a harmonic.
Figure 21B:
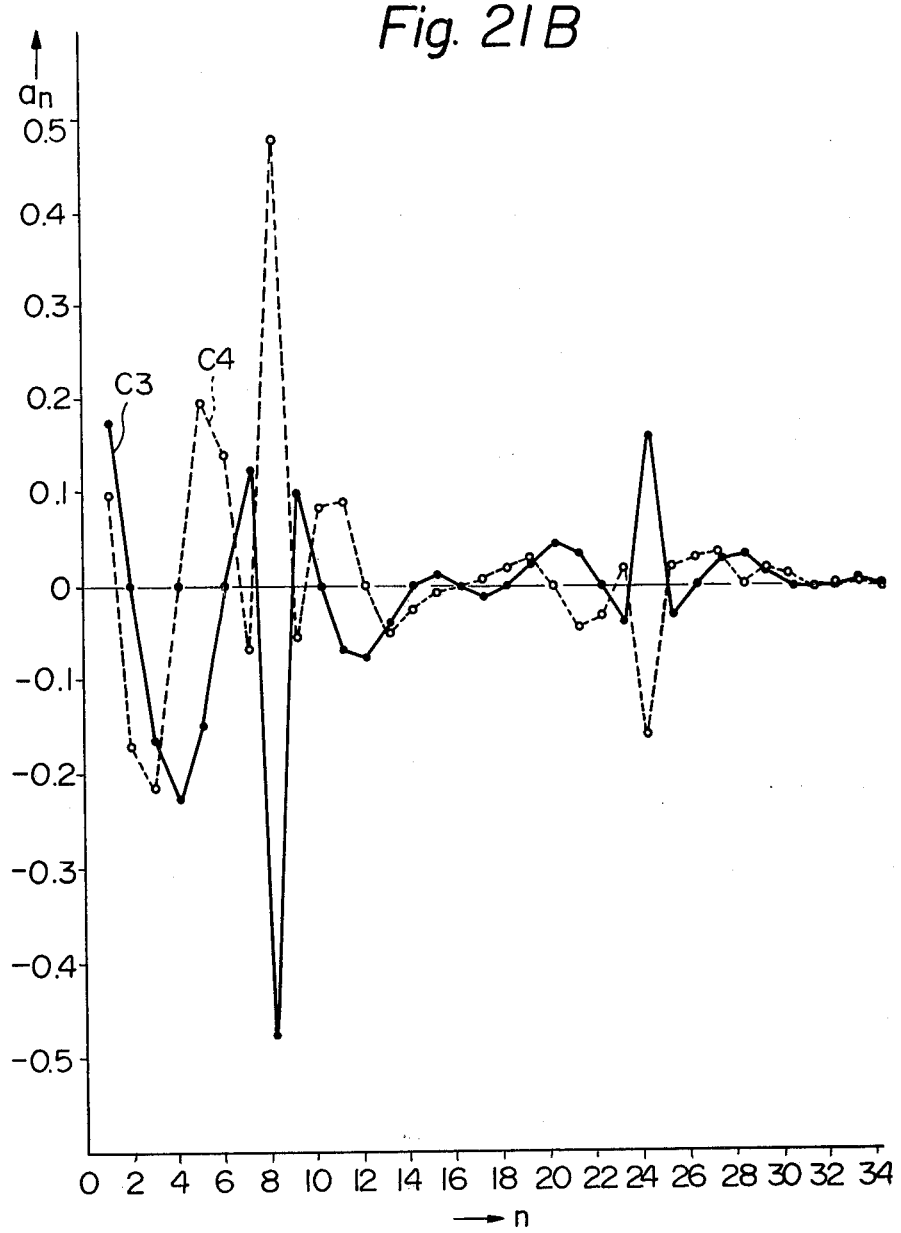

Now the value of each of the components C1 through C4 is calculated with respect to each order of the harmonic (n) within the range of n being equal to 1 through 34. FIGS. 21A and 21B depict graphs which indicate the variation of the calculated values of the components C1 through C4 with respect each order n being equal to 1 through 34. In other words, FIGS. 21A and 21B show the frequency spectrum contained in the output signal from the CCD 32 (FIG. 19.).

As seen from FIGS. 21A and 21B, in the CASES other than the CASE 1, that is the cases where the leads 12 are not correctly aligned with the corresponding pads 11, the component value of the fourth order of the harmonic, that is $a_4$ in the CASES C2 and C4, becomes equal to zero and the component value of the third order of the harmonic, that is $a_3$ in the CASE C3, becomes equal to zero. Contrary to the above, in the CASE C1 in which the leads 12 are correctly aligned with the pads 11, the component value of the eighth order of the harmonic, that is $a_8$, becomes the minimum value. Consequently, when the following three conditions (1), (2) and (3) are satisfied simultaneously, the leads 12 are correctly aligned with the corresponding pads 11.

(1) The component $a_8$ becomes the minimum value.
(2) The component $a_2$ is not equal to zero.
(3) The component $a_4$ is not equal to zero.

Returning to FIG. 19, band pass filters 61, 62 and 63, respectively, extract the signals having frequencies of $f_8$, $f_2$ and $f_4$ from the output signal of the CCD 32. The frequencies $f_8$, $f_2$ and $f_4$, respectively, correspond to the component values of $a_8$, $a_2$ and $a_4$. In other words, $f_8$, $f_2$ and $f_4$ are, respectively, equal to $8f_0$, $2f_0$ and $4f_0$, where the frequency $f_0$ is expressed by $f_0 = 1/t$. The symbol t denotes a time required for performing every scanning operation conducted by the CCD 32. The passing band signals from the filters 61, 62 and 63 are respectively supplied to an analogue switch 69. The switch 69 sequentially collects the values $a_8$, $a_2$ and $a_4$ under control of the unit 18. Each of the collected values $a_8$, $a_2$ and $a_4$ is applied to the unit 18 via an analogue/digital converter (A/D) 70. The unit 18 moves the IC package 14 till the aforesaid three conditions (1), (2) and (3) are satisfied.

It is preferable to utilize the so-called FFT (Fast Fourier Transfer) device to calculate the above recited Fourier series.

What is claimed is:

1. A method for aligning first objects and second objects, the first objects being mounted on a third object, the method comprising the steps of:
   (a) positioning the second objects above the first objects;
   (b) imaging the first objects and the third object with a sensor camera which generates an output signal to obtain a master image pattern comprising n-bit data, where n is an integer, to be stored in a storage device;
   (c) imaging the whole of the first and second objects and the third object with the sensor camera by locating the second objects directly above the first objects in order to obtain a scanned whole image pattern comprising n-bit data;
   (d) moving the first and second objects relative to each other within the field of view of the sensor camera;
   (e) constructing a relationship curve with respect to variations of a first variable indicating the displacement of the second objects from the first objects and a second variable indicating the variation of the output signal from the sensor camera, the second variable representing the variation of the total length of the second objects which are located only above the the portions of the third object on which the first objects are not mounted;
   (f) stopping the movement of the second objects when the value of the second variable defining the relationship curve becomes equal to a predetermined desired value which is expressed by the minimum total length of the images corresponding to the second objects which are located only above the portions of the third object on which the first objects are not mounted.

2. A method as set forth in claim 1, wherein, in step (e), the second variable is an alignment coefficient factor F which is defined by the equation $$F = \sum_{n=1}^{m} (\overline{M}_n \cdot S_n),$$

where the symbol $\overline{M}_n$ denotes the inverted bit data of the n-th bit of the m-bit data of the master image pattern, the symbol $S_n$ denotes the bit data of the n-th bit of the m-bit data of the scanned whole image pattern, the symbol·denotes a logical product, and the symbol m denotes the whole number of bits to be scanned by the sensor camera, and wherein in step (f), the predetermined desired value is the minimum value of the factor F.

3. A claim as set forth in claim 2, wherein step (f) further comprises, determining a destination point at which the second objects are correctly aligned with the first objects by detecting the middle point of a range in which the minimum value of the factor F is obtained.

4. A method as set forth in claim 2, wherein, step (f) includes stopping the second objects at the destination at which the second objects are correctly aligned with the respective first objects by shifting the second objects by half of the pitch with which the first and second objects are arranged from the position where the maximum value of the factor F is obtained.

5. A method as set forth in claim 2, wherein, step (e) includes determining the relationship curve so as to include a particular characteristic for differentiating between the one true destination at which the second objects are correctly aligned with the respective first objects and a similar quasi destination at which some of the second objects are correctly aligned with the first objects but at which the group of second objects are misaligned by k (k=1,2,3 . . .) times the pitch with which the first and second objects are arranged.

6. A method as set forth in claim 5, wherein, step (c) includes imaging the first and second objects within a field of view of the sensor camera, the field of view including at least all of the first and second objects.

7. A method as set forth in claim 5, wherein, step (c) includes imaging the first and second objects within a field of view of the sensor camera, the field of view including two adjacent ends of the first and second objects.

8. A method as set forth in claim 5, further comprising providing an irregular portion in one of the second objects and a similar irregular portion in one of the first objects.

9. A method as set forth in claim 8, wherein the irregular portion is provided by removing the one of the second objects and the similar irregular portion is provided by removing the corresponding one of the first objects.

10. A method as set forth in claim 8, wherein the irregular portion is provided by enlarging the one of the second objects compared to the remaining second objects and also the similar irregular portion is provided by enlarging the corresponding one of the first objects.

11. A method for aligning first and second objects comprising the steps of:
   (a) positioning the second objects above the first objects;
   (b) imaging both the first and second objects with a sensor camera which generates an output signal and which is located thereabove;
   (c) moving the first and second objects relative to each other within the field of view of the sensor camera;
   (d) constructing a relationship curve representing a frequency spectrum of the wave of the output signal generated by the sensor camera; and
   (e) stopping the movement of the second objects when the fundamental wave component of the frequency spectrum is a maximum value, the fundamental wave component corresponding to V'/P', where the symbol V' denotes a scanning speed of the sensor camera and the symbol P' denotes a pitch with which the first and second objects are arranged.

12. A method as set forth in claim 11, wherein, step (e) includes counting the number of the first and second objects and comparing the counted result with a predetermined number so as to differentiate between the one true destination at which the second objects are correctly aligned with the respective first objects and similar quasi destinations at which some of the second objects are correctly aligned with the first objects but at which the groups of first and second objects are misaligned by k (k=1,2,3 . . .) times the pitch with which the first and second objects are arranged.

13. A method as set forth in claim 1, or 11, wherein the method includes providing, as the first objects, terminal pads and providing, as the second objects, circuit leads.

* * * * *

UNITED STATES PATENT AND TRADEMARK OFFICE
CERTIFICATE OF CORRECTION

PATENT NO.　 :　 4,319,845
DATED　　　 :　 MARCH 16, 1982
INVENTOR(S) :　 TAKESHITA SHUJI.

It is certified that error appears in the above—identified patent and that said Letters Patent is hereby corrected as shown below:

```
Front page, [57] ABSTRACT, "camera, and;" should be
                  --camera; and--.
Col. 3,   line 65,  delete "a".
Col. 5,   line 17,  "processor" should be --process--;
          line 34,  "operation "SCAN")" should be
                    --operation ("SCAN")--;
          line 57,  "data" should be --data,--.
Col. 6,   line 5,   delete "perfectly".
Col. 7,   line 10,  delete "the";
          line 62,  "that" (first occurrence) should be
                    --than--.
Col. 10,  line 14,  delete ",";
          line 36,  "When" should be --Then--.
Col. 12,  line 7,   "I" should be --T--.
Col. 13,  line 42,  "sereis" should be --series--.
Col. 18,  line 3,   change "1," to --1--.
```

Signed and Sealed this

Fifteenth Day of June 1982

[SEAL]

Attest:

GERALD J. MOSSINGHOFF

Attesting Officer　　Commissioner of Patents and Trademarks